(12) United States Patent
Michii

(10) Patent No.: US 6,858,938 B2
(45) Date of Patent: Feb. 22, 2005

(54) SEMICONDUCTOR DEVICE

(75) Inventor: Kazunari Michii, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 59 days.

(21) Appl. No.: 10/361,561

(22) Filed: Feb. 11, 2003

(65) Prior Publication Data

US 2004/0026789 A1 Feb. 12, 2004

(30) Foreign Application Priority Data

Aug. 8, 2002 (JP) ........................................ 2002-231318

(51) Int. Cl.[7] .......................... H01L 23/48; H01L 23/52; H01L 29/40
(52) U.S. Cl. ..................................... 257/777; 257/686
(58) Field of Search ................................ 257/686, 685, 257/777, 723, 724

(56) References Cited

U.S. PATENT DOCUMENTS 5,998,864 A * 12/1999 Khandros et al.
6,215,182 B1 * 4/2001 Ozawa et al.
6,252,305 B1 * 6/2001 Lin et al.
6,433,421 B2 * 8/2002 Masuda et al.
6,476,474 B1 * 11/2002 Hung
6,552,437 B1 * 4/2003 Masuda et al.
6,621,155 B1 * 9/2003 Perino et al.

FOREIGN PATENT DOCUMENTS

| JP | P2000-315776 A | 11/2000 |
| JP | P2002-43503 A | 2/2002 |

* cited by examiner

Primary Examiner—S. V. Clark
(74) Attorney, Agent, or Firm—McDermott Will & Emery LLP

(57) ABSTRACT

A semiconductor device includes a substrate; an external electrode terminal for electrically connecting to an external electrode; a first semiconductor chip provided above the substrate, having a plurality of electrode pads disposed on a major surface thereof; a second semiconductor chip provided above the first semiconductor chip, having a plurality of electrode pads disposed on a major surface thereof; and connection lines for connecting the electrode pads to the external electrode. A part of the major surface of the first semiconductor chip faces a part of the surface opposite to the major surface of the second semiconductor chip; and the first semiconductor chip is shifted from the second semiconductor chip, so that the second semiconductor chip does not overlap the electrode pads of the first semiconductor chip.

6 Claims, 4 Drawing Sheets

SEMICONDUCTOR DEVICE

BACKGROUND OF THE INVENTION

1. Field of the Invention

The present invention relates to a semiconductor device. More specifically the present invention relates to a semiconductor device having two or more laminated semiconductor chips.

2. Background Art

FIG. 5 is a schematic sectional view for illustrating a conventional semiconductor device. FIG. 6 is a partially perspective schematic top view for illustrating a conventional semiconductor device. FIG. 7 is a schematic diagram for illustrating a constitution of a DRAM, which is a typical conventional memory.

As shown in FIG. 5, in a semiconductor device 300, a lower semiconductor chip 44 is mounted on the substrate 42, and an upper semiconductor chip 46 is mounted on the center portion of the lower semiconductor chip 44.

Solder balls 50 are formed on a back of the substrate 42. On the other hand, as shown in FIG. 6, bonding pads 52 and 54 are squarely arranged along circumferences of the semiconductor chips 44 and 46. Also as shown in FIGS. 5 and 6, an end of each of wires 56 and 58 is connected to each of the bonding pads 52 and 54, respectively, and the other end of each of wires 56 and 58 is connected to each of solder balls 50.

As described above, in each of the semiconductor chips 44 and 46, the bonding pads 52 and 54 are squarely arranged along the circumferences thereof, respectively. When such semiconductor chips 44 and 46 are stacked in two levels and packaged as in the semiconductor device 300, wires 56 must be connected to the bonding pads 52 of the lower semiconductor chip 44, which is disposed in the lower level, therefore, it is necessary that the upper semiconductor chip 46 does not overlap the bonding pads 52. Consequently, the upper semiconductor chip 46 must be smaller than the lower semiconductor chip 44 by the space for arranging the bonding pads 52.

Therefore, in the case of the constitution like the semiconductor device 300, the lower semiconductor chip cannot be the same as, or of the same size as the upper semiconductor chip. That is, this means that since two or more memory ICs of the same size cannot be stacked in the semiconductor device, and a size of the upper semiconductor chip is limited, increase in a capacity of the memory ICs is also limited.

As shown in FIG. 7, in a semiconductor chip 60 packaged in a DRAM, which is a typical conventional memory, bonding pads 62 are often arranged in line on a center portion thereof. In such a case, if the same semiconductor chip is to be further stacked on the semiconductor chip 60, the upper semiconductor chip overlaps the bonding pads 62. Therefore, a plurality of semiconductor chips cannot be stacked when such semiconductor chips are packaged.

SUMMARY OF THE INVENTION

Therefore, the present invention proposes a semiconductor device that can solve the above-described problems, and can package semiconductor chips in high density to reduce a size of the semiconductor device, while increasing a memory capacity.

According to one aspect of the present invention, a semiconductor device comprises a substrate; an external electrode terminal on the substrate, for electrically connecting to an external electrode; a first semiconductor chip provided above the substrate, having a plurality of electrode pads disposed on a major surface thereof; a second semiconductor chip provided above the first semiconductor chip, having a plurality of electrode pads disposed on a major surface thereof; and connection lines for connecting the electrode pads to the external electrode. A part of the major surface of the first semiconductor chip faces a part of the surface opposite to the major surface of the second semiconductor chip. The first and second semiconductor chips are disposed in shifted state, so that the second semiconductor chip does not overlap the electrode pads of the first semiconductor chip.

Other and further objects, features and advantages of the invention will appear more fully from the following description.

DETAILED DESCRIPTION OF THE PREFERRED EMBODIMENTS

Figure 1:
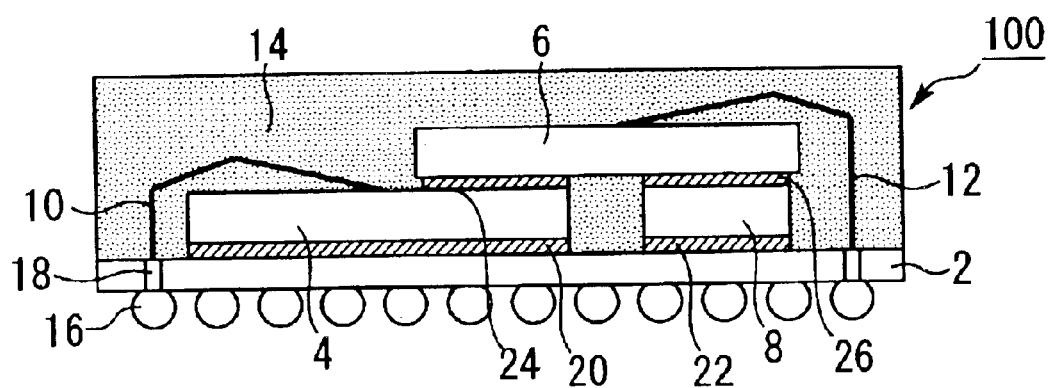
FIG. 1 is a schematic sectional view for illustrating a semiconductor device 100 according to a first embodiment of the present invention.

The embodiments of the present invention will be described below referring to the drawings. In the drawings, the same or corresponding parts are denoted by the same reference numerals, and the description thereof will be simplified or omitted.

First Embodiment

Figure 2:
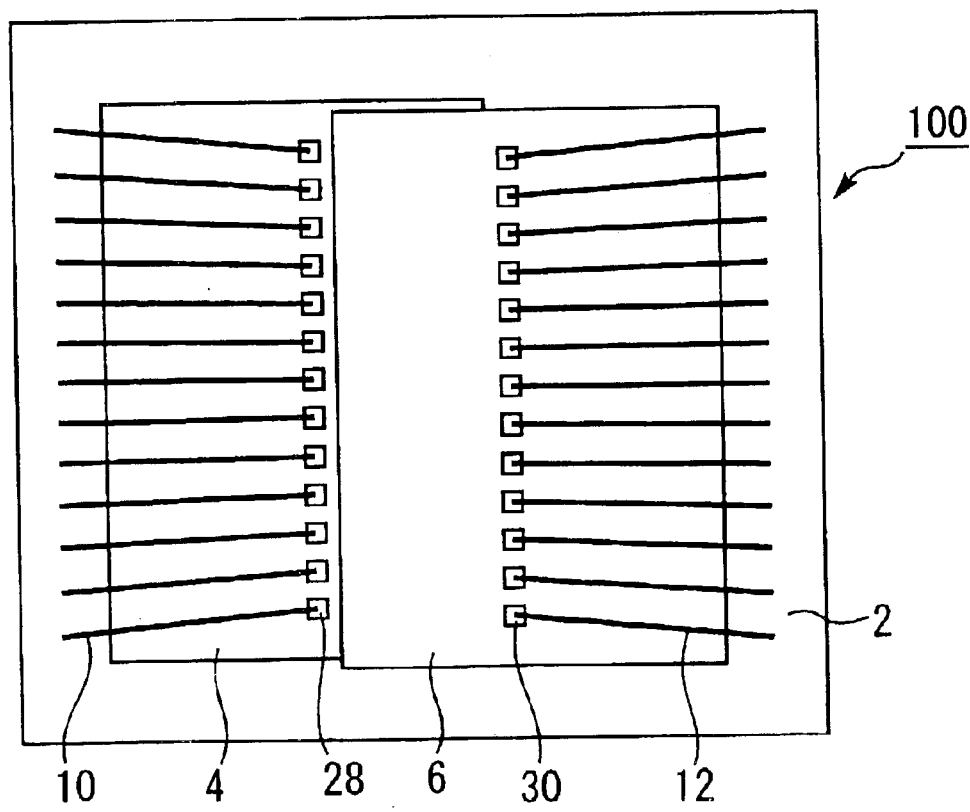
FIG. 2 is a perspective top view illustrating a packaged state of semiconductor chips 4 and 6 packaged in the semiconductor device 100 according to a first embodiment of the present invention.

FIG. 1 is a schematic sectional view for illustrating a semiconductor device 100 according to a first embodiment of the present invention. FIG. 2 is a perspective top view illustrating a packaged state of semiconductor chips 4 and 6 packaged in the semiconductor device 100.

As shown in FIG. 1, the semiconductor device 100 includes a substrate 2, a lower semiconductor chip 4, an upper semiconductor chip 6, a dummy chip 8, wires 10 and 12, and a synthetic resin 14. Specifically, the lower semiconductor chip 4 and the dummy chip 8 are mounted on the substrate 2, and the upper semiconductor chip 6 is mounted on the lower semiconductor chip 4 and the dummy chip 8. The wires 10 and 12 are connected between the upper and lower semiconductor chips 4 and 6 and the substrate 2, respectively. In this state, these are encapsulated with the synthetic resin 14 to constitute the semiconductor device 100. In the first embodiment, the lower semiconductor chip 4 is the same chip of the same size as the upper semiconductor chip 6. The lower semiconductor chip 4 has the same height as the dummy chip 8.

Solder balls 16 are formed on a back of the substrate 2. The solder balls 16 are used as terminals for connection with external electrodes. There are provided leads 18 that pass through the substrate 2 to the surface thereof in the portions that contact the solder balls 16 on the back of the substrate 2.

The lower semiconductor chip 4 is mounted on a part of the surface of the substrate 2 through a die-bonding material 20. The dummy chip 8 is bonded on the other part of the substrate 2 through a die-bonding material 22 in the state apart from the lower semiconductor chip 4. That is, as shown in FIG. 1, the lower semiconductor chip 4 is disposed on a left-hand side of the substrate 2, and the dummy chip 8 is disposed on a right-hand side of the substrate 2 apart from the lower semiconductor chip 4. Here, the dummy chip 8 is formed of Si.

The upper semiconductor chip 6 is mounted so as to bridge a surface of the lower semiconductor chip 4 and a surface of the dummy chip 8 through die-bonding materials 24 and 26. Specifically, the portion where the upper semiconductor chip 6 contacts the surface of the lower semiconductor chip 4 is bonded with the die-bonding material 24; and the portion where the upper semiconductor chip 6 contacts the surface of the dummy chip 8 is bonded with the die-bonding material 26.

As shown in FIG. 2, bonding pads 28 are arranged in line on a center portion of the surface of the lower semiconductor chip 4 and in a direction parallel to two facing sides of said first semiconductor chip; and bonding pads 30 are arranged in line on a center portion of the surface of the upper semiconductor chip 6.

As shown in FIGS. 1 and 2, the upper semiconductor chip 6 is bonded with the die-bonding material 24 to one of the portions of the lower semiconductor chip 4 partitioned into two portions by the bonding pads 28 disposed on the center portion of the surface of the lower semiconductor chip 4. On the other hand, the upper semiconductor chip 6 is also bonded with the die-bonding material 26 on the dummy chip 8.

Specifically, as shown in FIGS. 1 and 2, the lower semiconductor chip 4 is divided into two portions, left and right, by the bonding pads 28 disposed on a center portion thereof. A left-hand side of the back of the upper semiconductor chip 6 is bonded only on a right-hand side of the lower semiconductor chip 4. Also, a right-hand side of the upper semiconductor chip 6 is bonded on the dummy chip 8 with the die-bonding material 30. Thus, the upper semiconductor chip 6 is supported by the lower semiconductor chip 4 and the dummy chip 8.

Each wire 10 is connected to each bonding pad 28 of the lower semiconductor chip 4 at an end, and connected to a lead 18 on the surface of the substrate 2 at the other end. The wire 10 is disposed so as to pass an opposite side of the portion of the two portions partitioned by the bonding pads 28, where on the upper semiconductor chip 6 is placed, i.e., above the left-hand portion of the lower semiconductor chip 4 in FIGS. 1 and 2, and connects the lead 18 to the bonding pad 28.

Each wire 12 is connected to each bonding pad 30 of the upper semiconductor chip 6 at an end, and connected to a lead 18 on the surface of the substrate 2 at the other end. The wire 12 is disposed so as to pass the opposite side of the portion of the two portions partitioned by the bonding pads 28, which is bonded to the lower semiconductor chip 4, i.e., above the right-hand portion of the upper semiconductor chip 6 in FIGS. 1 and 2, and connects the lead 18 to the bonding pad 30.

According to the first embodiment, as described above, the lower semiconductor chip 4 and the upper semiconductor chip 6 are disposed with the centers thereof shifted from each other so that the upper semiconductor chip 6 does not overlap the bonding pads 28 of the lower semiconductor chip 4. Accordingly, two or more semiconductor chips can be stacked even when semiconductor chips having bonding pads on the center portions are used. Also in this case, the same semiconductor chips can be stacked on each other. Therefore, a semiconductor device having a large memory capacity and a reduced size can be obtained.

In the first embodiment, the dummy chip 8 is disposed underneath the upper semiconductor chip 6. Accordingly, damage on the semiconductor chips 4, 6 during wire bonding can be prevented even when the upper semiconductor chip 6 is large to some extent.

In the first embodiment, both the lower semiconductor chip 4 and the upper semiconductor chip 6 having bonding pads 28 and 30 arranged in the centers thereof were described. However, the present invention is not limited thereto, but the bonding pads may be disposed on the locations away from the centers. In this case also, the upper semiconductor chip can be stacked on the location shifted state, a dummy chip can be disposed at need under the upper semiconductor chip for supporting the portion where the upper semiconductor chip does not overlap the lower semiconductor chip.

Also in this embodiment, the case where the same semiconductor chips are stacked is described; however, the present invention is not limited thereto, but semiconductor chips of different sizes or of different types may be stacked.

Also in this embodiment, the case where two semiconductor chips are stacked was described; however, the present invention is not limited to two semiconductor chips, but more than two semiconductor chips may be stacked. In this case also, the upper semiconductor chip may be stacked in a direction shifted state, so as not to overlap the bonding pads of the semiconductor chip disposed on the lower level.

Also in the first embodiment, the case where the lower semiconductor chip 4 is disposed in the left-hand side, and the dummy chip 8 is disposed in the right-hand side, referring to the drawings was described. However, the disposing location is not limited thereto, but these can be disposed in an opposite way, or in other directions. Also, the case where the lower semiconductor chip 4 and the dummy chip 8 are disposed apart from each other was described; however, the lower semiconductor chip 4 may contact the dummy chip 8. Also, the case where the dummy chip is composed of Si was described; however, in the present invention, the material of the dummy chip is not limited to Si.

Second Embodiment

Figure 3:
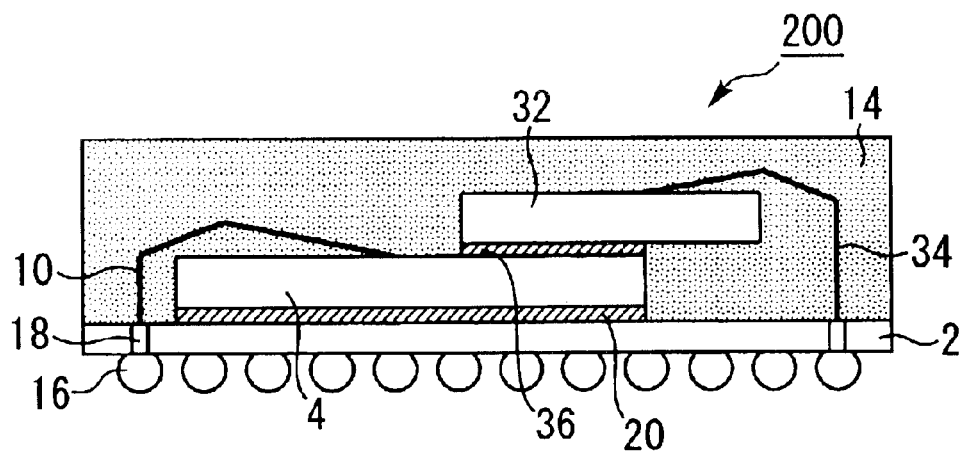
FIG. 3 is a schematic sectional view for illustrating a semiconductor device 200 according to a second embodiment of the present invention.
Figure 4:
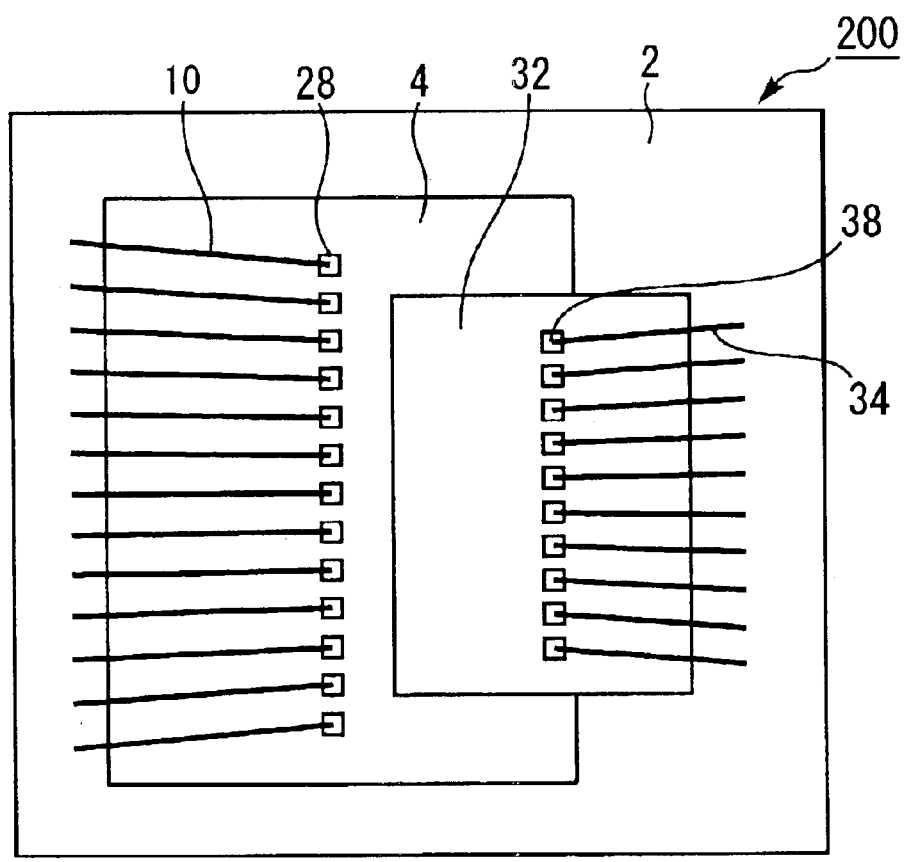
FIG. 4 is a perspective top view illustrating a packaged state of semiconductor chips packaged in the semiconductor device 200 according to a second embodiment of the present invention.
Figure 5:
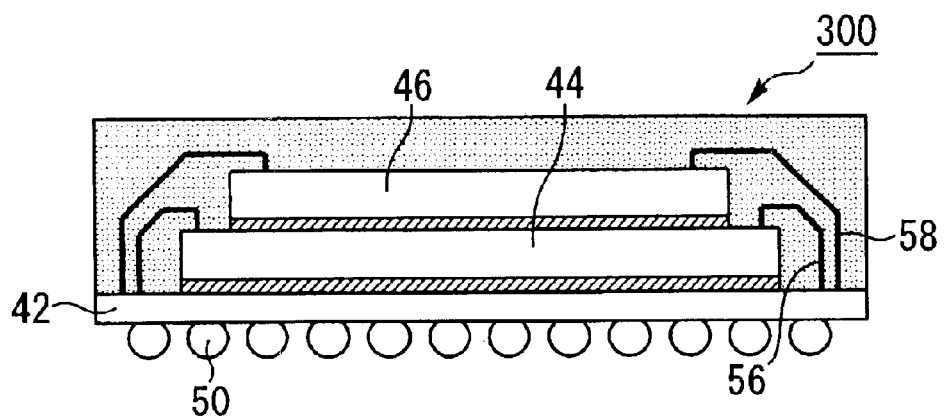
FIG. 5 is a schematic sectional view for illustrating a conventional semiconductor device.
Figure 6:
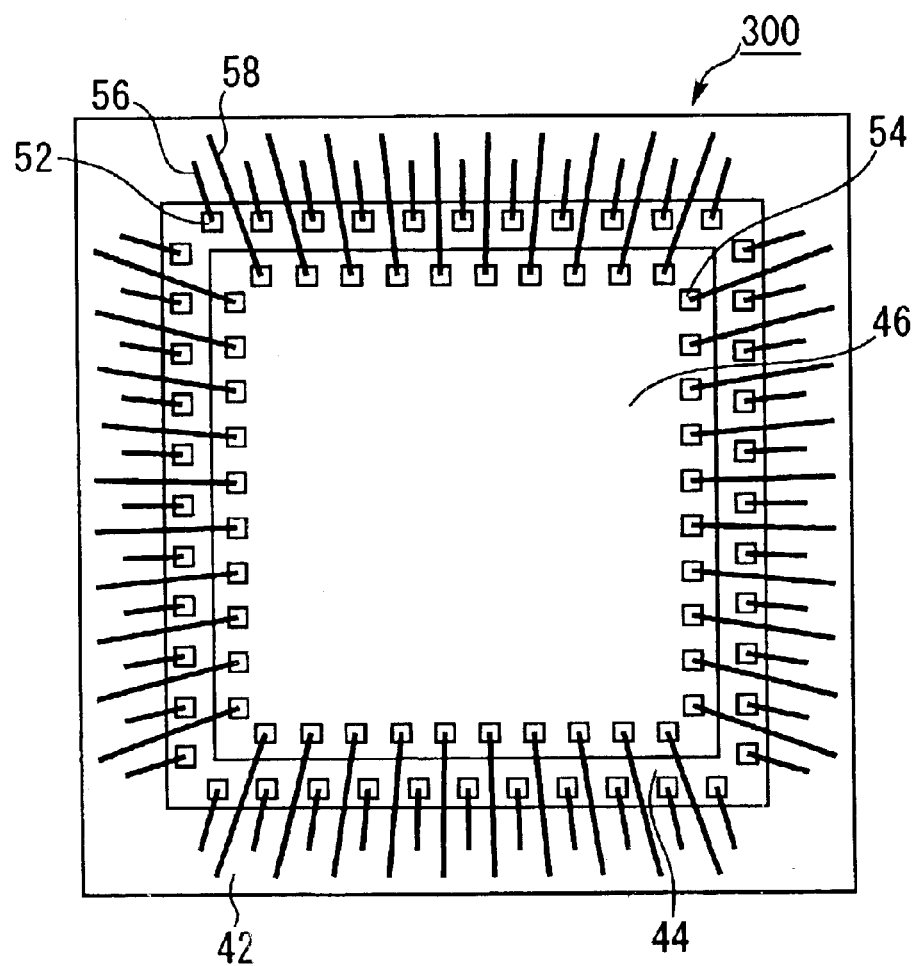
FIG. 6 is a partially perspective schematic top view for illustrating a conventional semiconductor device.
Figure 7:
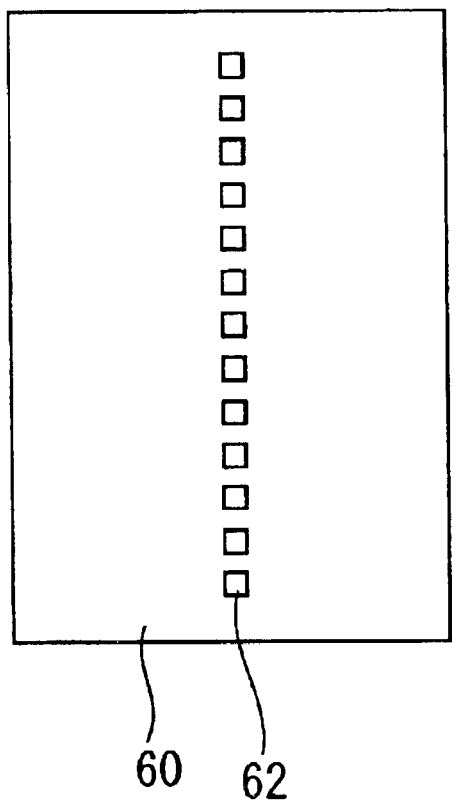
FIG. 7 is a schematic diagram for illustrating a constitution of a DRAM, which is a typical conventional memory.

FIG. 3 is a schematic sectional view for illustrating a semiconductor device 200 according to a second embodiment of the present invention; and FIG. 4 is a perspective top view illustrating a packaged state of semiconductor chips packaged in the semiconductor device 200.

The semiconductor device 200 includes a substrate 2, a lower semiconductor chip 4, an upper semiconductor chip 32, wires 10 and 34, and a synthetic resin 14.

In the semiconductor device 200 shown in FIG. 3, the substrate 2 and the lower semiconductor chip 4, disposed in the lower level, are identical to those described for the semiconductor device 100 of the first embodiment.

However, the upper semiconductor chip 32, mounted on the lower semiconductor chip 4, has a different size from the lower semiconductor chip 4.

Also as shown in FIG. 4, in the second embodiment, bonding pads 28 are arranged in line on a center portion of the lower semiconductor chip 4 as in the first embodiment. Bonding pads 38 are also arranged in line on a center portion of the upper semiconductor chip 32.

As also shown in FIGS. 3 and 4, the upper semiconductor chip 32 is bonded with a die-bonding material 36 to the one side of the lower semiconductor chip 4 partitioned by the bonding pads 28 of the lower semiconductor chip 4. Specifically in the state shown in FIGS. 3 and 4, a right-hand side portion of the lower semiconductor chip 4 is bonded to a left-hand side portion of the upper semiconductor chip 32 with the die-bonding material 36.

Each wire 34 is connected to each bonding pad 38 of the upper semiconductor chip 32 at an end, and connected to a lead 18 on a surface of the substrate 2 at the other end. The wire 34 is disposed so as to pass an opposite side of the portion of the two portions partitioned by the bonding pads 38 of the upper semiconductor chip 32, which is bonded to the lower semiconductor chip 4, i.e., above the right-hand portion of the upper semiconductor chip 32 in FIGS. 3 and 4, and connects the lead 18 to the bonding pad 38.

In the second embodiment, the upper semiconductor chip 32 is smaller than the lower semiconductor chip 4. Therefore, the portion of the back of the semiconductor chip 32 not supported by the lower semiconductor chip 4 is small even if the semiconductor chip 32 is disposed in a shifted state so as not to overlap the bonding pads 20 arranged on a center portion of the lower semiconductor chip 4. Therefore, in the semiconductor device 200, no dummy chip is provided under the semiconductor chip 32. Even in this state, the semiconductor chip 32 is supported by the lower semiconductor chip 4 with a sufficient strength.

Since other parts are the same as in the first embodiment, the description thereof will be omitted.

According to the second embodiment, as described above, no dummy chip is required when the semiconductor chip mounted in the upper level is small, and the process for manufacturing the dummy chip can be omitted. Therefore, a process speed of semiconductor manufacturing can be raised, and the costs for the manufacture of semiconductor devices can be reduced.

In the second embodiment, the case where the upper semiconductor chip 32 is smaller than the lower semiconductor chip 4 was described. However, the present invention is not limited thereto, but the upper semiconductor chip 32 may be of the same size as, or larger than the lower semiconductor chip 4 if the upper semiconductor chip 32 is supported by the lower semiconductor chip 4 with a sufficient strength.

In the present invention, the external electrode terminal is a terminal used for electrically connecting the external electrode to the semiconductor device, and for example, the solder balls 16 in the first and second embodiments fall under this definition. In the present invention, the first semiconductor chip is a semiconductor chip disposed in the lower position of the laminated semiconductor chips, and for example, the lower semiconductor chip 4 in the first and second embodiments falls under this definition. In the present invention, the second semiconductor chip is a semiconductor chip disposed in the upper position of the laminated semiconductor chips, and for example, the upper semiconductor chips 6 and 32 in the first and second embodiments, respectively, fall under this definition. Also in the present invention, for example, the bonding pads 28, 30, and 38 in the first and second embodiments fall under the electrode pads, and for example, wires 10, 12, and 34 in the first and second embodiments fall under the connection lines.

The features and the advantages of the present invention as described above may be summarized as follows.

According to one aspect of the present invention, a semiconductor device comprises two semiconductor chips laminated in two levels, and the upper semiconductor chip is disposed on the lower semiconductor chip shifted so that only a part of each semiconductor chip faces to the other. Therefore, since a large semiconductor chip can be laminated on the upper level regardless of the positions of the electrode pads, a semiconductor device having a large memory capacity and reduced size can be obtained.

In another aspect, the upper semiconductor chip can be shifted from the lower semiconductor chip, semiconductor chips can be laminated even when the electrode pads are arranged in line on the center, and thereby, a densely packaged semiconductor device can be obtained.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-231318, filed on Aug. 8, 2002 including specification, claims, drawings and summary, on which the Convention priority of the present application is based, are incorporated herein by reference in its entirety.

What is claimed is:

1. A semiconductor device comprising:

a substrate;

an external electrode terminal on said substrate, for electrically connecting to an external electrode;

a first semiconductor chip provided above said substrate, having a plurality of electrode pads arranged in line on a center portion of a major surface thereof;

a second semiconductor chip provided above said first semiconductor chip, having a plurality of electrode pads disposed on a major surface thereof; and connection lines for connecting said electrode pads to said external electrode, wherein a part of the major surface of said first semiconductor chip faces a part of the surface opposite to the major surface of said second semiconductor chip, and said first and second semiconductor chips are disposed in shifted state, so that said second semiconductor chip does not overlap the electrode pads of said first semiconductor chip.

2. The semiconductor device according to claim 1, wherein said first semiconductor chip has the same size as said second semiconductor chip.

3. A semiconductor device comprising:

a substrate;

an external electrode terminal on said substrate, for electrically connecting to an external electrode;

a first semiconductor chip provided above said substrate, having a plurality of electrode pads disposed on a major surface thereof;

a second semiconductor chip provided above said first semiconductor chip, having a plurality of electrode pads disposed on a major surface thereof;

a dummy chip having the same height as said first semiconductor chip on an area underneath said second semiconductor chip not overlapping said first semiconductor chip; and connection lines for connecting said electrode pads to said external electrode, wherein a part of the major surface of said first semiconductor chip faces a part of the surface opposite to the major surface of said second semiconductor chip, and said first and second semiconductor chips are disposed in shifted state, so that said second semiconductor chip does not overlap the electrode pads of said first semiconductor chip.

4. The semiconductor device according to claim 3, wherein said electrode pads of said first semiconductor chip are arranged in line in a direction parallel to two facing sides of said first semiconductor chip, and said second semiconductor chip in overlaid between one side of said two facing sides of said first semiconductor chip and said electrode pads arranged in line of said first semiconductor chip.

5. The semiconductor device according to claim 4, wherein said first semiconductor chip has the same size as said second semiconductor chip.

6. The semiconductor device according to claim 3, wherein said first semiconductor chip has the same size as said second semiconductor chip.

* * * * *